United States Patent
Polnyi (10) Patent No.: US 7,632,115 B1
(45) Date of Patent: Dec. 15, 2009

(54) ELECTRICAL CONNECTOR ASSEMBLY HAVING PICK UP CAP WITH ADJUSTABLE SECTIONS

(75) Inventor: Igor Polnyi, Aurora, IL (US)

(73) Assignee: Hon Hai Precision Ind. Co., Ltd., Taipei Hsine (TW)

( * ) Notice: Subject to any disclaimer, the term of this patent is extended or adjusted under 35 U.S.C. 154(b) by 0 days.

(21) Appl. No.: 12/218,863

(22) Filed: Jul. 18, 2008

(51) Int. Cl.
*H01R 13/44* (2006.01)
(52) U.S. Cl. .................................................. 439/135
(58) Field of Classification Search ............... 439/135, 439/940, 41, 342, 331
See application file for complete search history.

(56) References Cited

U.S. PATENT DOCUMENTS

| | | | | |
|---|---|---|---|---|
| 6,905,353 B2 * | 6/2005 | Ma et al. | | 439/135 |
| 7,140,890 B1 * | 11/2006 | Ju | | 439/135 |
| 2005/0136711 A1 * | 6/2005 | Ma | | 439/135 |
| 2008/0009158 A1 * | 1/2008 | Ma et al. | | 439/135 |
| 2008/0045048 A1 * | 2/2008 | Ma | | 439/73 |
| 2009/0061652 A1 * | 3/2009 | Fan | | 439/41 |

* cited by examiner

*Primary Examiner*—Chandrika Prasad
(74) *Attorney, Agent, or Firm*—Andrew C. Cheng; Wei Te Chung; MIng Chieh Chang (57) ABSTRACT

An electrical connector assembly (200) for connecting an electronic package with a circuit substrate, comprising a housing assembly (50) with a number of contacts (90) received therein, a lift-up device (20) assembled to the housing assembly (50) and moved from a first position to a second position, and a pick up cap (40) disposed between the housing assembly (50) and the lift-up device (20). The pick up cap (40) includes a body portion (401) and an wing portion (402) that can be assembled to the body portion (401). The wing portion (402) is moved relative to the body portion (401) when the lift-up device (20) is in a close position for preventing interference with the lift-up device (20).

19 Claims, 7 Drawing Sheets

ELECTRICAL CONNECTOR ASSEMBLY HAVING PICK UP CAP WITH ADJUSTABLE SECTIONS

BACKGROUND OF THE INVENTION

1. Field of the Invention

The present invention relates to an electrical connector assembly, and more particularly, to an assembly with a pickup cap having an adjustable part which can protect the contacts of the assembly when leveled with the body of the pick up cap, while is moved to avoid interference with the pressing portions of the load plate within which the connector assembly is assembled.

2. Description of the Prior Art

Figure 6:
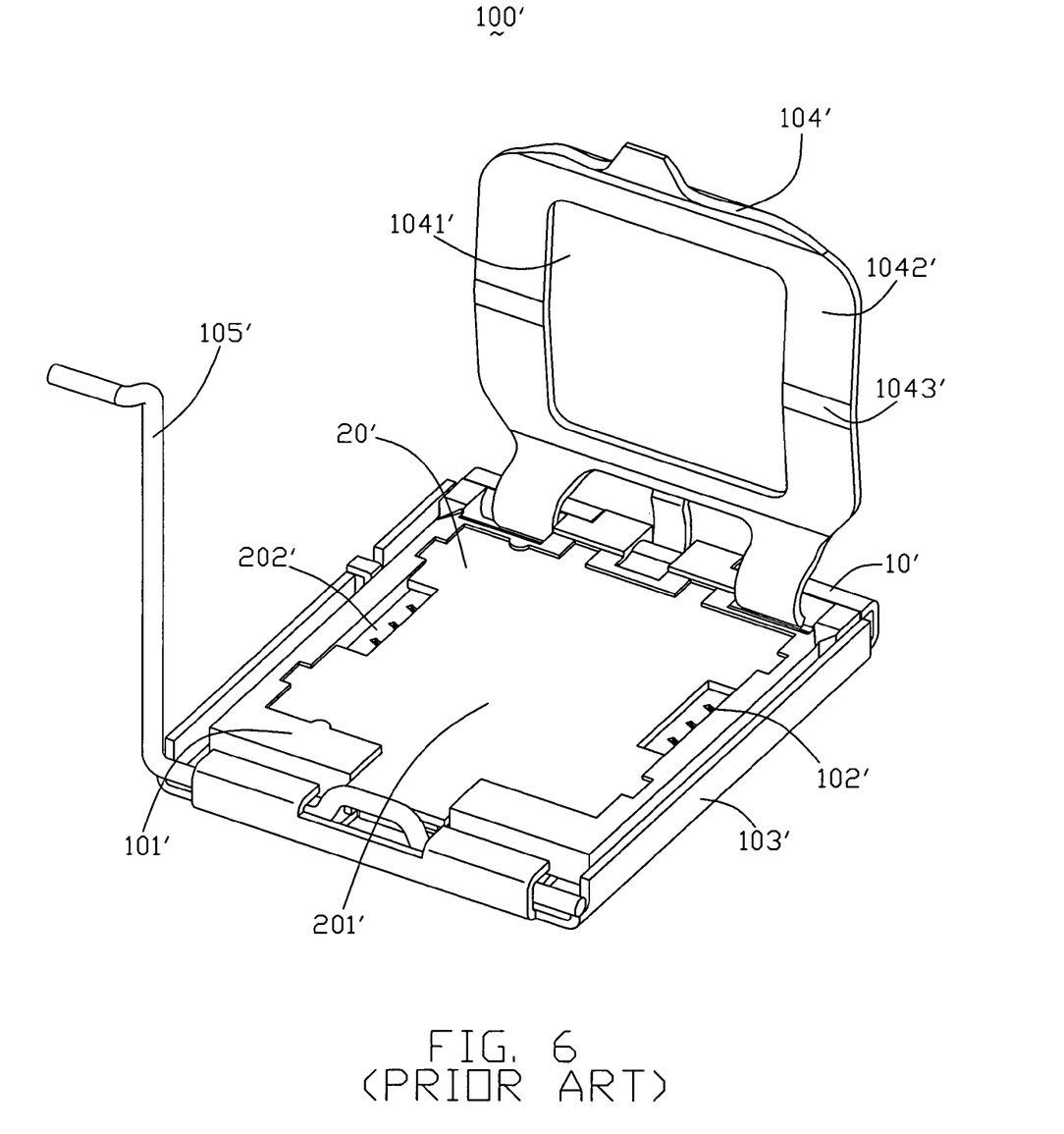
FIG. 6 is an isometric view of a conventional electrical connector assembly, showing the load plate is in an open position.

U.S. Pat. No. 6,905,353 discloses a conventional electrical connector assembly 100' for electrically connecting a CPU (not shown) with a PCB (not shown). Referring to FIG. 6, the connector assembly 100 comprises an electrical connector 10' and a pick up cap 20' attached to the electrical connector 10' to provide a flat top surface 201' for a vacuum suction device. The electrical connector 10' comprises an insulative housing 101', a number of contacts 102' received in the insulative housing 101', a stiffener 103' surrounded the insulative housing 101', a load plate 104' pivotably attached to one end of the stiffener 103' and a lever 105' pivotably attached to the other end of the stiffener 103'.

When the pick up cap 20' is assembled to the electrical connector 10', the pick up cap 20' locates between the insulative housing 101' and the load plate 104'. The load plate 104' defines a center window 1041' and comprises two ribs 1042' having two pressing portions 1043' respectively. The pressing portions 1043' can press the CPU for making a good electrical connection between the CPU and the contacts 102'. The pick up cap 20' defines two gaps 202' relative to the pressing portions 1043' of the load plate 104' for preventing interference with the pressing portions 1043' when the load plate 104' is fastened to the insulative housing 101' by the lever 105'.

Figure 7:
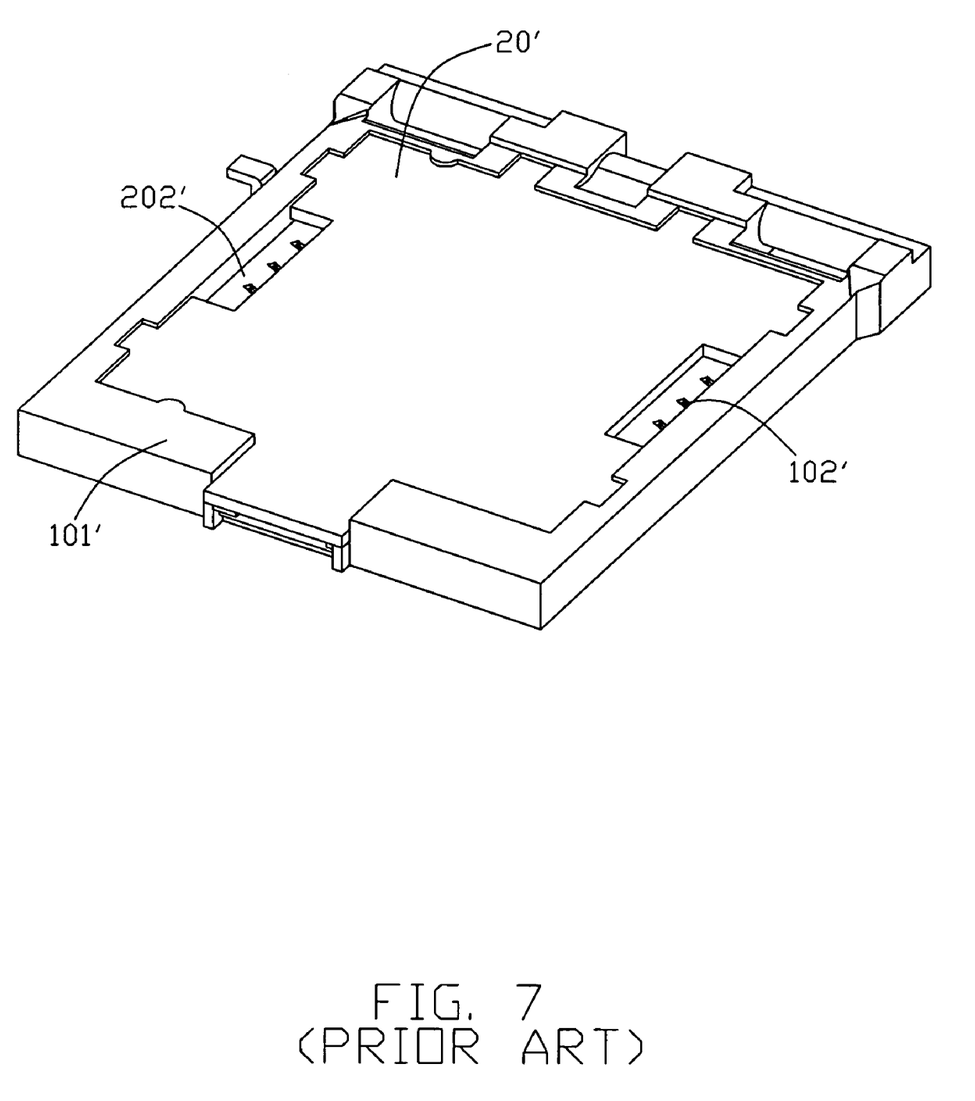
FIG. 7 is an assembled view of the pick up cap and the insulative housing of FIG. 6.

Referring to FIG. 7, in the process of transportation, the pick up cap 20' is attached onto the insulative housing 101'. Therefore, the contacts 102' under the gaps 202' will expose to the air and will result in contamination or damage.

In view of the above, a new electrical connector assembly that overcomes the above-mentioned disadvantages is desired.

SUMMARY OF THE INVENTION

Accordingly, an object of the present invention is to provide an electrical connector assembly having an improved pick up cap that can provide protection of the whole contacts.

To fulfill the above-mentioned object, an electrical connector assembly for connecting an electronic package with a circuit substrate comprising a housing assembly with a number of contacts received therein, a lift-up device assembled to the housing assembly, and moved from an open position to a close position and a pick up cap disposed between the housing assembly and the lift-up device, the pick up cap comprises a body portion and an wing portion assembled to the body portion, the additional member is moved relative to the body portion when the lift-up device is in the close position.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
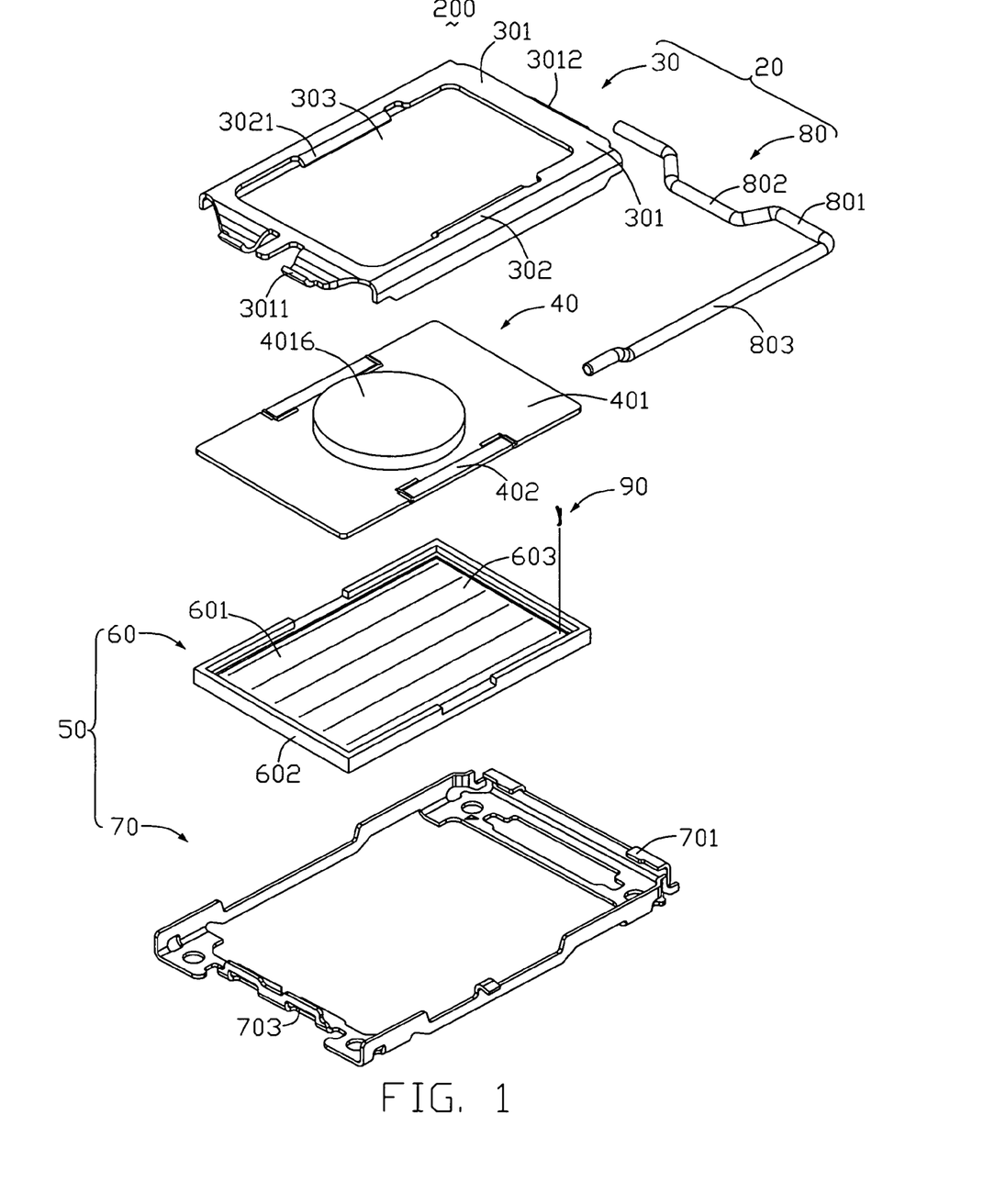
FIG. 1 is an exploded view of an electrical connector assembly in accordance with the preferred embodiment of the present invention.

Referring to FIG. 1, an electrical connector assembly 200 is used for electrically connecting an electronic package, such as a land grid array (LGA) central processing unit (CPU) (not shown), with a circuit substrate, such as a printed circuit board (PCB) (not shown). The electrical connector assembly 200 comprises a housing assembly 50, a number of contacts 90 received in the housing assembly 50, a lift-up device 20 assembled to the housing assembly 50, and a pick up cap 40 disposed between the housing assembly 50 and the lift-up device 20.

The housing assembly 50 comprises an insulative housing 60 and a stiffener 70 surrounded the insulative housing 60. The insulative housing 60 comprises a bottom wall 601 and four sidewalls 602 extending from the bottom wall 601. The bottom wall 601 and the sidewalls 602 define a cavity 603 therebetween for receiving the CPU. The bottom wall 601 defines a plurality of passageways (not labeled) for receiving the contacts 90. When the contacts 90 are assembled to the insulative housing 60, the contacts 90 protrude a predetermined height above the bottom wall 601 of the insulative housing 60 for contacting with the CPU. The stiffener 70 is formed by stamping and bending a single sheet of metal into a rectangular plate and comprises a pair of retaining cavities 703 on one end and a pair of retaining elements 701 on the other end.

The lift-up device 20 comprises a load plate 30 and a lever 80. The load plate 30 is formed by stamping a metal sheet and comprises two short sides 301 and two long sides 302 jointing with the two short sides 301. The short sides 301 and the long sides 302 formed a window 303. The load plate 30 defines an interlocking element 3012 on one short side 301, a pair of bearing tongues 301 on the other short side 301, and a pair of pressing portions 3021 curvedly toward the insulative housing 60 on the long sides 302 for pressing the CPU.

The lever 80 is formed by bending a single metallic wire and includes a pair of rotary shafts 801. A locking section 802 is disposed between the two rotary shafts 801. An actuating section 803 for rotating the rotary shafts 801 is bent at a right angle with respect to the rotary shafts 801.

Figure 2:
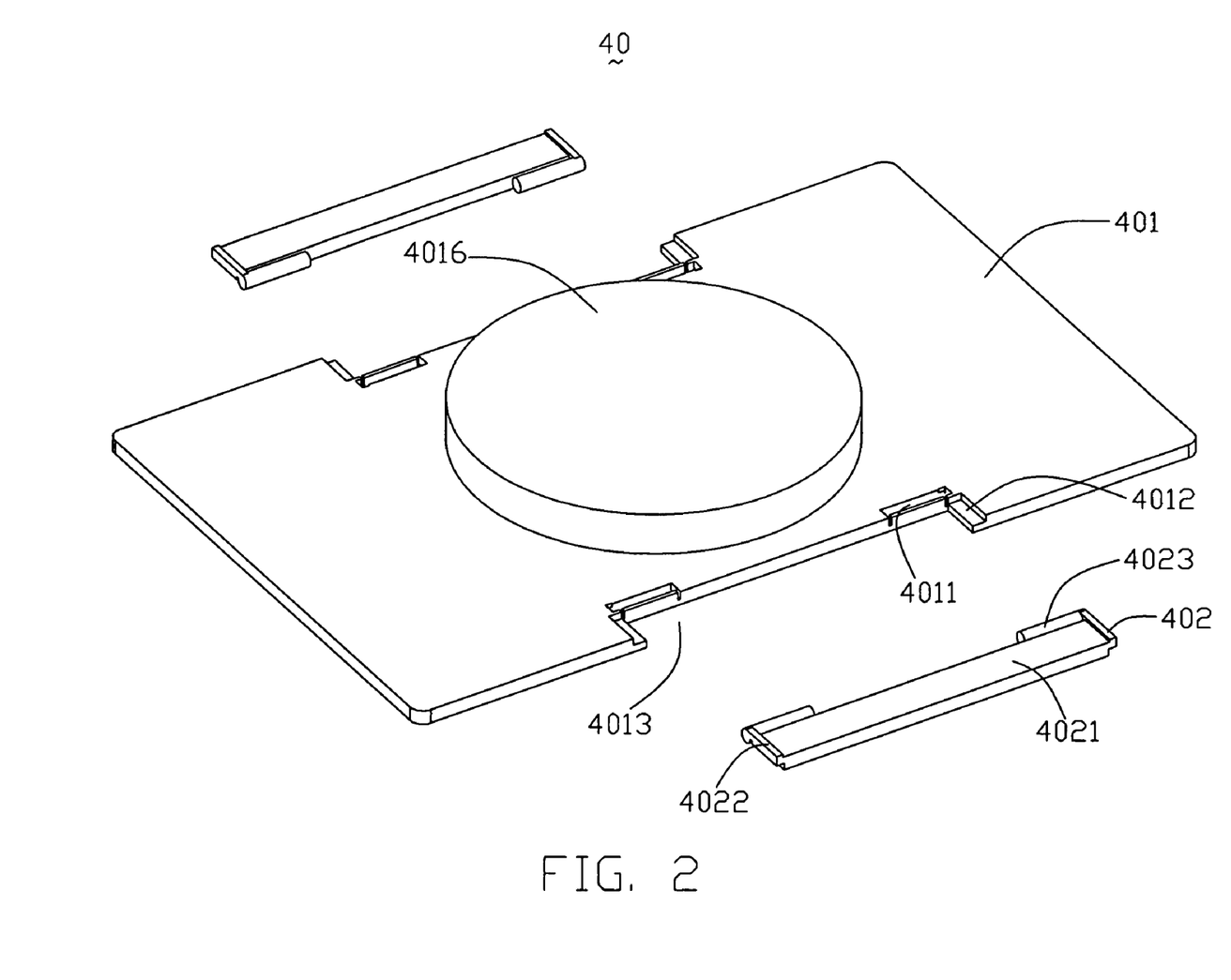
FIG. 2 is an exploded view of the pick up cap of the electrical connector assembly of the present invention.
Figure 4:
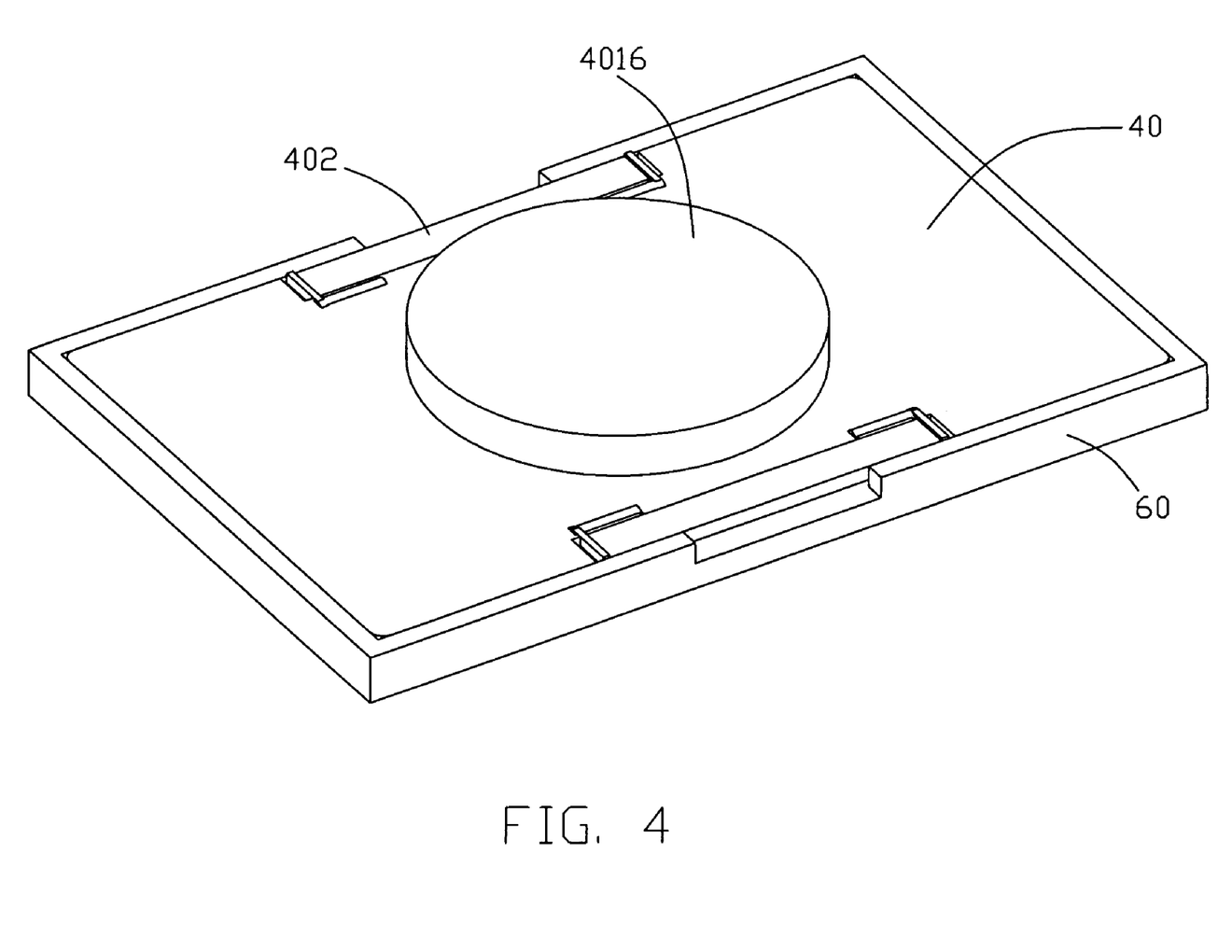
FIG. 4 is an assembled view of the pick up cap and the insulative housing of the present invention.

Referring to FIG. 2, the pick up cap 40 comprises a body portion 401 and a pair of wing portions 402. The body portion 401 defines a flat top surface 4016 for a vacuum suction device (not showing) and a pair of recesses 4013. The body portion 401 also defines two gaps 4011 near the rear of the recess 4013 but are separating from the recess 4013, and two sunken portions 4012 connected with the recess 4013. The two gaps 4011 are formed along the recess 4013 and in the same line approximately. The wing portion 402 comprises a plate portion 4021, two extending portions 4022 at opposite end thereof and two fixing portions 4023 connecting with the extending portions 4022. The extending portion 4022 and the plate portion 4021 form a step shape, the two fixing portions 4023 are formed in the inner side of the wing portion 402. Referring to FIG. 4, When the wing portion 402 is assembled to the body portion 401, the fixing portions 4023 are positioned in the gaps 4011 and the extending portion 4022 is located upon the sunken portion 4012, so that the wing portion 402 can completely cover the recess 4013 of the pick up cap 40.

Figure 3:
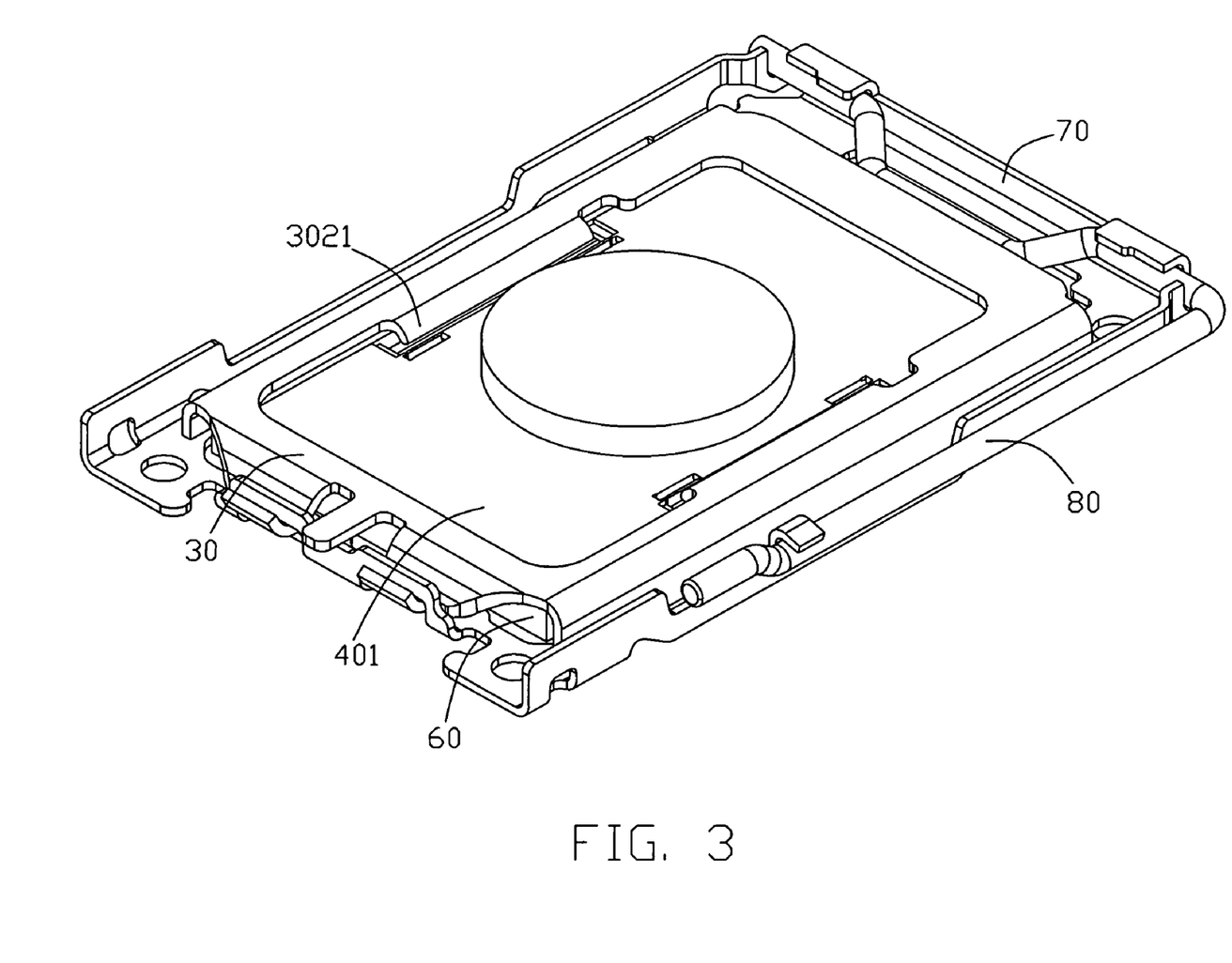
FIG. 3 is an assembled view of FIG. 1, showing the wing portions are detached from the pick up cap of the present invention.

Referring to FIG. 3, depict the first embodiment of the present invention. In this embodiment, showing the assembled view of the electrical connector assembly 200. The lift-up device 20 is in a close position. The load plate 30 is pivotably attached to one end of the stiffener 70, and the lever 80 is pivotably attached to the other end of the stiffener 70. The pick up cap 40 is positioned between the load plate 30 and the insulative housing 60. The flat surface 4016 go through the window 303 to be sucked by a vacuum suction device. In this station, the wing portions 402 are detached from the pick up cap 40 preventing interference with the pressing portions 3021 of the load plate 30. After rotating the lever 80, the load plate 30 moves to an open position.

Referring to FIG. 4, in the process of transportation, the lift-up device 20 is separated with the insulative housing 60 and the pick up cap 40 is attached to the insulative housing 60. In this situation, the wing portion 402 is assembled to the pick up cap 40 so that the pick up cap 40 can protect the whole contacts 90 on the insulative housing 60 from contamination or damage.

Figure 5:
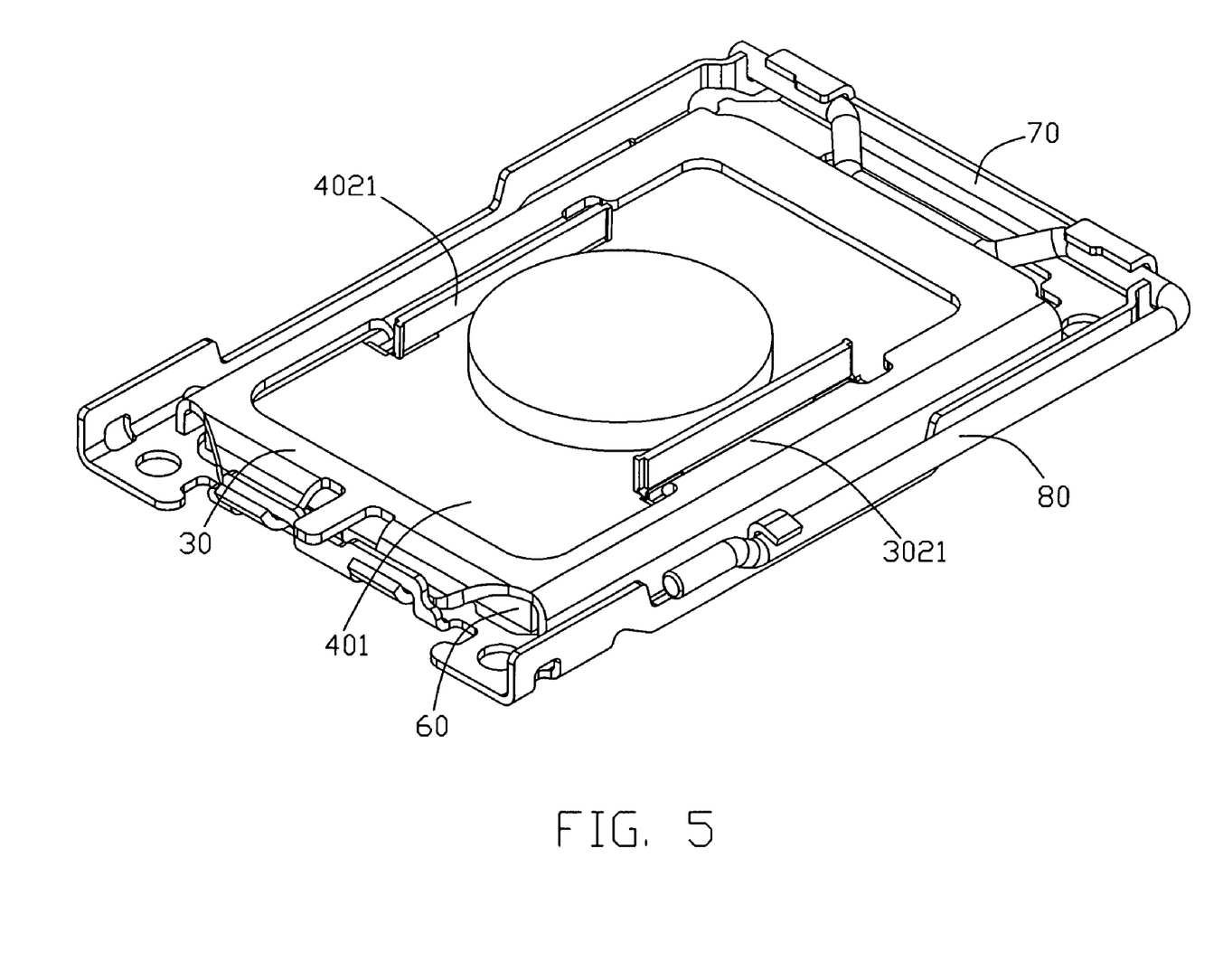
FIG. 5 is an assembled view of FIG. 1, showing the wing portions are rotated relative to the body portion of the pick up cap of the present invention.

Referring to FIG. 5, depict the second embodiment of the present invention. The differences between the second embodiment and the first embodiment of the present invention is the wing portions 4021 are still attached with the body portion 401 when the lift-up device 20 is in the close position. In this embodiment, the wing portions 4021 are rotated about the fixing portions 4023 to permit the pressing portions 3021 to extend into the recesses 4013, for preventing interference with the pressing portions 3021 of the load plate 30. In this embodiment, the wing portion 4021 is erected vertically to be substantially vertical to the body portion 401.

In the above detailed description, the pick up cap 40 comprises a body portion 401 and a pair of wing portions 402. In the state of transportation, the wing portions 402 are assembled to the body portion 401 for making a protection of the whole contacts 90. When the lift-up device 20 is assembled to the insulative housing 60, the wing portions 402 are moved relative to the body portion 401 for preventing interference with the pressing portions 3021 of the load plate 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly for connecting an electronic package with a circuit substrate, comprising:
   a housing assembly with a number of contacts received therein;
   a lift-up device disposed upon the housing assembly, and moved from an open position to a close position; and
   a pick up cap disposed between the housing assembly and the lift-up device, the pick up cap comprising a body portion and an wing portion pivotally assembled to the body portion.

2. The electrical connector assembly as claimed in claim 1, wherein the wing portion is detached from the body portion when the lift-up device is in the close position.

3. The electrical connector assembly as claimed in claim 1, wherein the body portion defines a flat surface and a pair of recesses for receiving the wing portion.

4. The electrical connector assembly as claimed in claim 3, wherein the body portion defines a pair of gaps and sunken portions adjacent to each recess.

5. The electrical connector assembly as claimed in claim 4, wherein the gaps are separating from the recess.

6. The electrical connector assembly as claimed in claim 5, wherein the wing portion includes a plate portion, a pair of extending portions at opposite ends thereof and a pair of fixing portions at an inner side thereof.

7. The electrical connector assembly as claimed in claim 6, wherein when the wing portion is assembled to the body portion, the fixing portions of the wing portion are located in the gaps of the body portion and the extending portions of the wing portion are received in the sunken portions of the body portion.

8. The electrical connector assembly as claimed in claim 1, wherein the area of the pick up cap is almost the same size of the housing assembly.

9. The electrical connector assembly as claimed in claim 3, wherein the wing portion is rotated relative to the body portion and moved away from the recess when the lift-up device is in the close position.

10. The electrical connector assembly as claimed in claim 3, wherein the housing assembly includes an insulative housing and a stiffener surrounded the insulative housing.

11. The electrical connector assembly as claimed in claim 10, wherein the lift-up device includes a load plate pivotally assembled to one end of the stiffener and a lever pivotally assembled to the other end of the stiffener.

12. The electrical connector assembly as claimed in claim 11, wherein the load plate includes a pair of pressing portions curvedly toward the insulative housing and the wing portion is rotated relative to the body portion to permit the pressing portions to extend into the recess of the pick up cap when the lift-up device is in the close position.

13. The electrical connector assembly as claimed in claim 12, wherein the wing portion is erected vertically to be substantially vertical to the body portion.

14. An electrical connector assembly comprising:
   an insulative housing defining an upward facing receiving cavity;
   a plurality of contacts disposed in the housing and exposed into the receiving cavity;
   a retention structure separated from while surrounding the housing having means for holding an electronic package in said receiving cavity;
   a pick up cap for suction, mounted to the housing and including a main body covering most areas of the receiving cavity and a moveable piece covering remaining other portions of the receiving cavity.

15. The electrical connector as claimed in claim 14, wherein the remaining other portions are located in a periphery region of the receiving cavity.

16. The electrical connector as claimed in claim 14, wherein said retention structure includes a structure which share a same space with the moveable piece when said retention structure assembled to a printed circuit board with the housing.

17. The electrical connector as claimed in claim 14, wherein said structure is formed on a pivotal load plate of said retention structure.

18. The electrical connector as claimed in claim 14, wherein said moveable piece is pivotally assembled to the main body.

19. The electrical connector as claimed in claim 14, wherein said moveable piece is detachable from the main body.

* * * * *